United States Patent
Lee et al.

(10) Patent No.: US 7,675,003 B2
(45) Date of Patent: Mar. 9, 2010

(54) LASER IRRADIATION DEVICE, PATTERNING METHOD AND METHOD OF FABRICATING ORGANIC LIGHT EMITTING DISPLAY (OLED) USING THE PATTERNING METHOD

(75) Inventors: Jae-Ho Lee, Suwon-si (KR); Tae-Min Kang, Suwon-si (KR); Seong-Taek Lee, Suwon-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 376 days.

(21) Appl. No.: 11/286,411

(22) Filed: Nov. 25, 2005

(65) Prior Publication Data

US 2006/0205101 A1    Sep. 14, 2006

(30) Foreign Application Priority Data

Dec. 3, 2004  (KR)  ..................... 10-2004-0101424

(51) Int. Cl.
*B23K 26/06* (2006.01)
(52) U.S. Cl. ........................ 219/121.73; 219/121.75; 219/121.6
(58) Field of Classification Search ............ 219/121.73, 219/121.75, 121.6
See application file for complete search history.

(56) References Cited

U.S. PATENT DOCUMENTS

| | | | |
|---|---|---|---|
| 4,377,339 A | | 3/1983 | Coppock |
| 5,172,369 A | * | 12/1992 | Chikuma et al. ........ 369/112.24 |
| 5,362,940 A | * | 11/1994 | MacDonald et al. ... 219/121.68 |
| 5,768,023 A | | 6/1998 | Sawaki et al. |
| 6,582,875 B1 | | 6/2003 | Kay et al. |
| 2001/0009251 A1 | * | 7/2001 | Sekizawa et al. ........ 219/121.73 |
| 2004/0188393 A1 | * | 9/2004 | Li et al. ................... 219/121.7 |

(Continued)

FOREIGN PATENT DOCUMENTS

CN          1346232          4/2002

(Continued)

OTHER PUBLICATIONS

European Office Action of the European Patent Application No. 05 11 1621, issued on May 24, 2006.

(Continued)

*Primary Examiner*—M. Alexandra Elve
(74) *Attorney, Agent, or Firm*—Robert E. Bushnell, Esq.

(57) ABSTRACT

In a laser irradiation device, a patterning method and a method of fabricating an Organic Light Emitting Display (OLED) using the same. The laser irradiation device includes a light source, a mask, a projection lens, and a Fresnel lens formed at a predetermined portion of the mask to change an optical path. When an organic layer pattern is formed using the laser irradiation device, laser radiation is irradiated onto a region of an organic layer, which is to be cut, and the laser radiation is appropriately irradiated onto a region of the organic layer, which is to be separated from a donor substrate. The laser radiation irradiated onto an edge of the organic layer pattern has a laser energy density greater than that of the laser radiation irradiated onto other portions of the organic layer pattern. As a result, it is possible to form a uniform organic layer pattern and reduce damage of the organic layer.

6 Claims, 5 Drawing Sheets

U.S. PATENT DOCUMENTS

2005/0057804 A1* 3/2005 Umeya et al. ............... 359/449

FOREIGN PATENT DOCUMENTS

| CN | 1417285 | 5/2003 |
| --- | --- | --- |
| EP | 1 109 067 | 6/2001 |
| EP | 1 357 590 | 10/2003 |
| JP | 04-029142 | 1/1992 |
| JP | 11-026347 | 1/1999 |
| JP | 2001-217188 | 8/2001 |
| JP | 2001-239591 | 9/2001 |

OTHER PUBLICATIONS

An article "Computer generated beam shaping and focusing optical elements for laser material processing" written by Heinemann, published in Optics Communications, vol. 119, No. 5, pp. 613-622 on Sep. 15, 1995.

Chinese Office Action issued on Mar. 21, 2008, corresponding to Chinese Patent Application No. 200510129760.3 (with English translation).

Korean Patent Registration Gazette issued on Mar. 21, 2007 in the priority Korean Patent Application No. 2004-0101424.

Office action from the Japanese Patent Office issued in Applicant's corresponding Japanese Patent Application No. 2005-350913 dated Apr. 7, 2009.

Office Action from European Patent Office issued in Applicant's corresponding European Patent Application No. 05111621.8 dated Mar. 18, 2009.

M. Feldman et al., "Application of zone plates to alignment in microlithography"J. Vac. Sci. Technol., vol. 19, No. 4 (Nov./Dec. 1981) p. 1224-1228.

C. David et al., "Diffractive grey-tone phase masks for laser ablation lithography" Microelectronic Engineering, vol. 57-58, (Jan. 9, 2001) p. 453-460.

Patent Registration Gazette from Chinese Patent Office issued in Applicant's corresponding Chinese Patent Appilcation No. 200510129760.3.

* cited by examiner

LASER IRRADIATION DEVICE, PATTERNING METHOD AND METHOD OF FABRICATING ORGANIC LIGHT EMITTING DISPLAY (OLED) USING THE PATTERNING METHOD

CLAIM OF PRIORITY

This application makes reference to, incorporates the same herein, and claims all benefits accruing under 35 U.S.C.§119 from an application for LASER IRRADIATION DEVICE, PATTERNING METHOD AND FABRICATION METHOD OF ORGANIC ELECTROLUMINESCENCE DISPLAY DEVICE USING THE SAME earlier filed in the Korean Intellectual Property Office on 3 Dec. 2004 and there duly assigned Serial No. 10-2004-0101424.

BACKGROUND OF THE INVENTION

1. Field of the Invention

The present invention relates to a laser irradiation device, a patterning method and a method of fabricating an Organic Light Emitting Display (OLED) using the laser irradiation device, and more particularly, to a laser irradiation device, a patterning method and a method of fabricating an OLED using the method that are capable of partially adjusting laser density by providing a mask including a Fresnel lens for changing an optical path.

2. Description of the Related Art

In general, an Organic Light Emitting Display (OLED) among flat panel displays includes an anode electrode, a cathode electrode, and organic layers disposed between the anode and cathode electrodes. Each of the organic layers includes at least an emission layer. The OLED is classified into a polymer OLED and a small molecule OLED depending on the materials constituting the emission layers.

In order to realize a full color OLED, each of emission layers representing the three primary colors of red (R), green (G) and blue (B) must be patterned. In the case of the small molecule OLED, a method of patterning the emission layer uses a shadow mask, and in the case of the polymer OLED, an inkjet printing method or a Laser Induced Thermal Imaging (LITI) method is used. Among them, the LITI method can finely pattern the organic layer, and can easily realize a high resolution and large-sized display. Moreover, preferably, the LITI method is a dry process, whereas the inkjet printing method is a wet process.

In a method of fabricating an Organic Light Emitting Display (OLED) using a laser irradiation device, a substrate is provided, and a donor substrate having an organic layer is laminated on the substrate. Laser radiation is focused on a predetermined portion of the donor substrate through a laser irradiation device. The laser irradiation device includes a light source, a patterned mask, and a projection lens.

In this process, the laser radiation emitted by the light source passes through the patterned mask to the projection lens. The laser radiation is directed to the projection lens along a pattern formed on the mask. Then, the laser radiation is refracted through the projection lens and then irradiated onto the donor substrate in a shape of the pattern of the mask, thereby forming an organic layer pattern on the substrate.

In this process, a portion of the organic layer attached to the donor substrate and receiving the laser radiation, is separated from the donor substrate by the laser radiation and transferred to the substrate, and other portions' of the organic layer, which do not receive the laser radiation, are left on the donor substrate to form the organic layer pattern on the substrate. That is, connection between the portion receiving the laser radiation and the other portions not receiving the laser radiation is broken to form the organic layer pattern.

Then, an upper electrode is formed on the organic layer pattern to fabricate the OLED.

A uniform intensity of laser radiation is irradiated along the entire irradiated region. The intensity of the laser radiation required to cut the connection in the organic layer must be higher than that of the laser radiation required to separate and transfer the organic layer from the donor substrate. Eventually, laser radiation with a high intensity is applied to the organic layer in order to transfer the organic layer. Therefore, laser radiation with a high intensity is required in order to transfer the organic layer, and the laser radiation with a high intensity can damage the organic layer. On the other hand, when low intensity laser radiation is irradiated, a connection in the organic layer is insufficiently cut to make it difficult to obtain a uniform organic layer pattern.

SUMMARY OF THE INVENTION

The present invention, therefore, provides a laser irradiation device, a patterning method and a method of fabricating an Organic Light Emitting Display (OLED) using the method that are capable of partially adjusting laser density by providing a mask including a Fresnel lens for changing an optical path to reduce damage to the organic layer, and to improve the quality of the transferred organic layer pattern.

In one exemplary embodiment of the present invention, a laser irradiation device is provided including: a light source; a mask arranged under the light source; and a projection lens arranged under the mask. The mask includes a Fresnel lens arranged on a predetermined portion thereof to change an optical path of light generated by the light source.

The Fresnel lens is preferably arranged on at least one of an upper surface and a lower surface of the mask. The Fresnel lens is preferably arranged on the mask by machining a predetermined portion of the mask to have a Fresnel lens shape.

The mask preferably includes a transparent material. The transparent material preferably includes either glass or transparent plastic.

In another exemplary embodiment of the present invention, a patterning method is provided including: providing a substrate; providing a donor substrate having a transfer layer; laminating the donor substrate and the substrate; and irradiating laser radiation onto a region of the donor substrate, which is to be transferred to form a transfer layer pattern on the substrate. The laser radiation irradiated onto an edge of the irradiated region has an energy density greater than that of the laser radiation irradiated onto other portions of the irradiated region.

The laser radiation is preferably generated by a light source, a mask arranged under the light source and a projection lens arranged under the mask, and the mask preferably includes an element adapted to change an optical path of the laser radiation.

The element adapted to change the optical path of the laser radiation preferably includes a Fresnel lens. The Fresnel lens is preferably arranged on at least one of an upper surface and a lower surface of the mask.

The mask preferably includes a transparent material.

The Fresnel lens is preferably formed by machining a predetermined portion of the mask to have a Fresnel lens shape.

The transfer layer pattern is preferably formed in an $N_2$ atmosphere. The $N_2$ atmosphere is preferably formed by charging $N_2$ gas until each of $O_2$ and $H_2O$ is less than 100 ppm. The transfer layer pattern is alternatively preferably formed in a vacuum atmosphere.

In still another exemplary embodiment of the present invention, a method of fabricating an Organic Light Emitting Display (OLED) is provided, the method including: providing a substrate; providing a donor substrate having an organic layer; laminating the donor substrate on the substrate; and irradiating laser radiation onto the donor substrate corresponding to an organic layer pattern region to form the organic layer pattern on the substrate. The laser radiation irradiated onto an edge of the organic layer pattern of the donor substrate has a laser energy density greater than that of the laser radiation irradiated onto other portions of the organic layer pattern.

The laser radiation is preferably generated by a laser irradiation device including a light source, a mask arranged under the light source, and a projection lens arranged under the mask, and the mask preferably includes an element adapted to change an optical path of the laser radiation.

The element adapted to change an optical path of the laser radiation preferably includes a Fresnel lens.

The organic layer pattern is preferably formed in a $N_2$ atmosphere. The $N_2$ atmosphere is preferably formed by charging $N_2$ gas until each of $O_2$ and $H_2O$ is less than 100 ppm. The organic layer pattern is alternately preferably formed in a vacuum atmosphere.

BRIEF DESCRIPTION OF THE DRAWINGS

The accompanying drawings, which are included to provide a further understanding of the present invention and are incorporated in and constitute a part of this specification, illustrate embodiments of the present invention and together with the description serve to explain the principles of the present invention.

DETAILED DESCRIPTION OF THE INVENTION

Figure 1A:
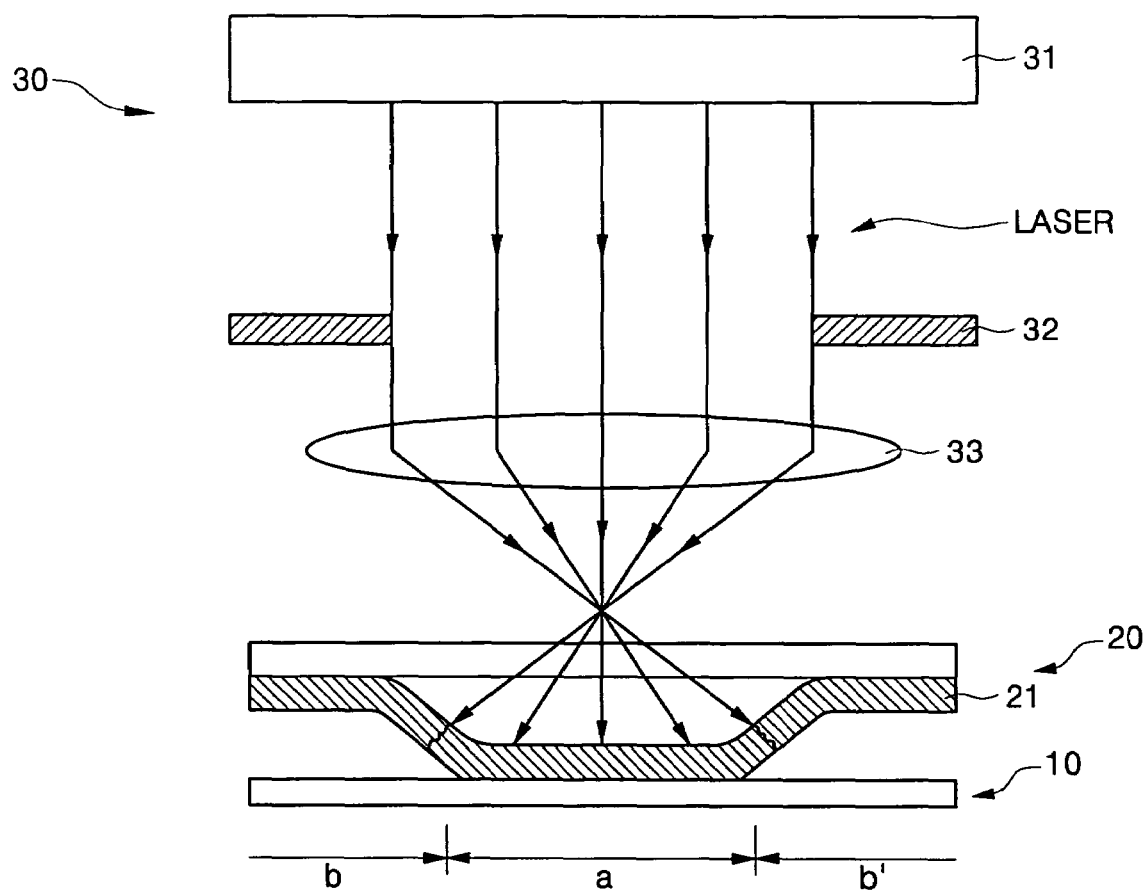
FIGS. 1A and 1B are a cross-sectional view and a laser profile of a method of fabricating an Organic Light Emitting Display (OLED) using a laser irradiation device.
Figure 1B:
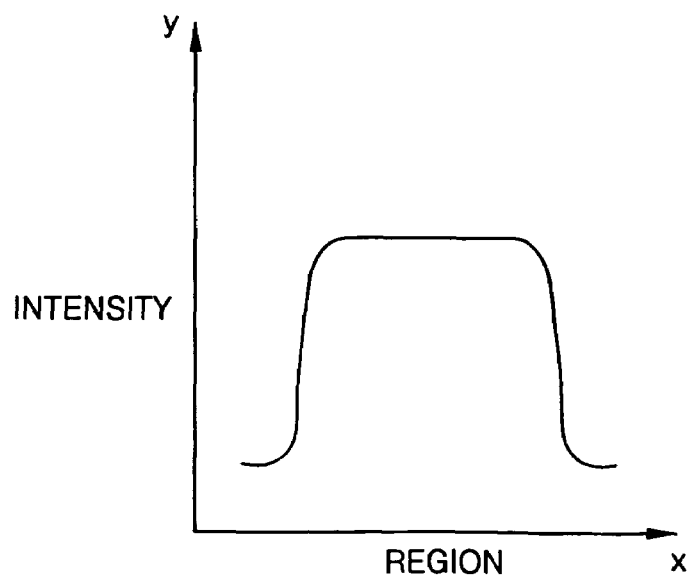

FIGS. 1A and 1B are a cross-sectional view and a laser profile of a method of fabricating an Organic Light Emitting Display (OLED) using a laser irradiation device.

Referring to FIG. 1A, a substrate 10a is provided, and a donor substrate 20 having an organic layer 21 is laminated on the substrate 10. Laser radiation is focused on a predetermined portion of the donor substrate 20 through a laser irradiation device 30. The laser irradiation device 30 includes a light source 31, a patterned mask 32, and a projection lens 33.

In this process, the laser radiation emitted by the light source 31 passes through the patterned mask 32 to the projection lens 33. The laser radiation is directed to the projection lens 33 along a pattern formed on the mask 32. Then, the laser radiation is refracted through the projection lens 33 and then irradiated onto the donor substrate 20 in a shape of the pattern of the mask 32, thereby forming an organic layer pattern on the substrate 10.

In this process, a portion a of the organic layer 21 attached to the donor substrate 20 and receiving the laser radiation, is separated from the donor substrate 20 by the laser radiation and transferred to the substrate 10, and other portions b and b' of the organic layer, which do not receive the laser radiation, are left on the donor substrate to form the organic layer pattern on the substrate 10. That is, connection between the portion a receiving the laser radiation and the other portions b and b' not receiving the laser radiation is broken to form the organic layer pattern.

Then, an upper electrode is formed on the organic layer pattern to fabricate the OLED.

Referring to FIG. 1B, a laser profile irradiated onto the donor substrate 20 is illustrated. An x-axis represents a region to which the laser radiation is irradiated, and a y-axis represents intensity of the laser radiation. As shown in FIG. 1B, it is appreciated that a uniform intensity of laser radiation is irradiated along the entire irradiated region. The intensity of the laser radiation required to cut the connection in the organic layer 21 must be higher than that of the laser radiation required to separate and transfer the organic layer 21 from the donor substrate 20. Eventually, laser radiation with a high intensity is applied to the organic layer 21 in order to transfer the organic layer 21. Therefore, laser radiation with a high intensity is required in order to transfer the organic layer 21, and the laser radiation with a high intensity can damage the organic layer 21. On the other hand, when laser radiation with a low intensity is irradiated, a connection in the organic layer 21 is insufficiently cut to make it difficult to obtain a uniform organic layer pattern.

The present invention will now be described more fully hereinafter with reference to the accompanying drawings, in which exemplary embodiments of the present invention are shown. The present invention can, however, be embodied in different forms and should not be construed as being limited to the embodiments set forth herein. Like numbers refer to like elements throughout the specification.

Figure 2:
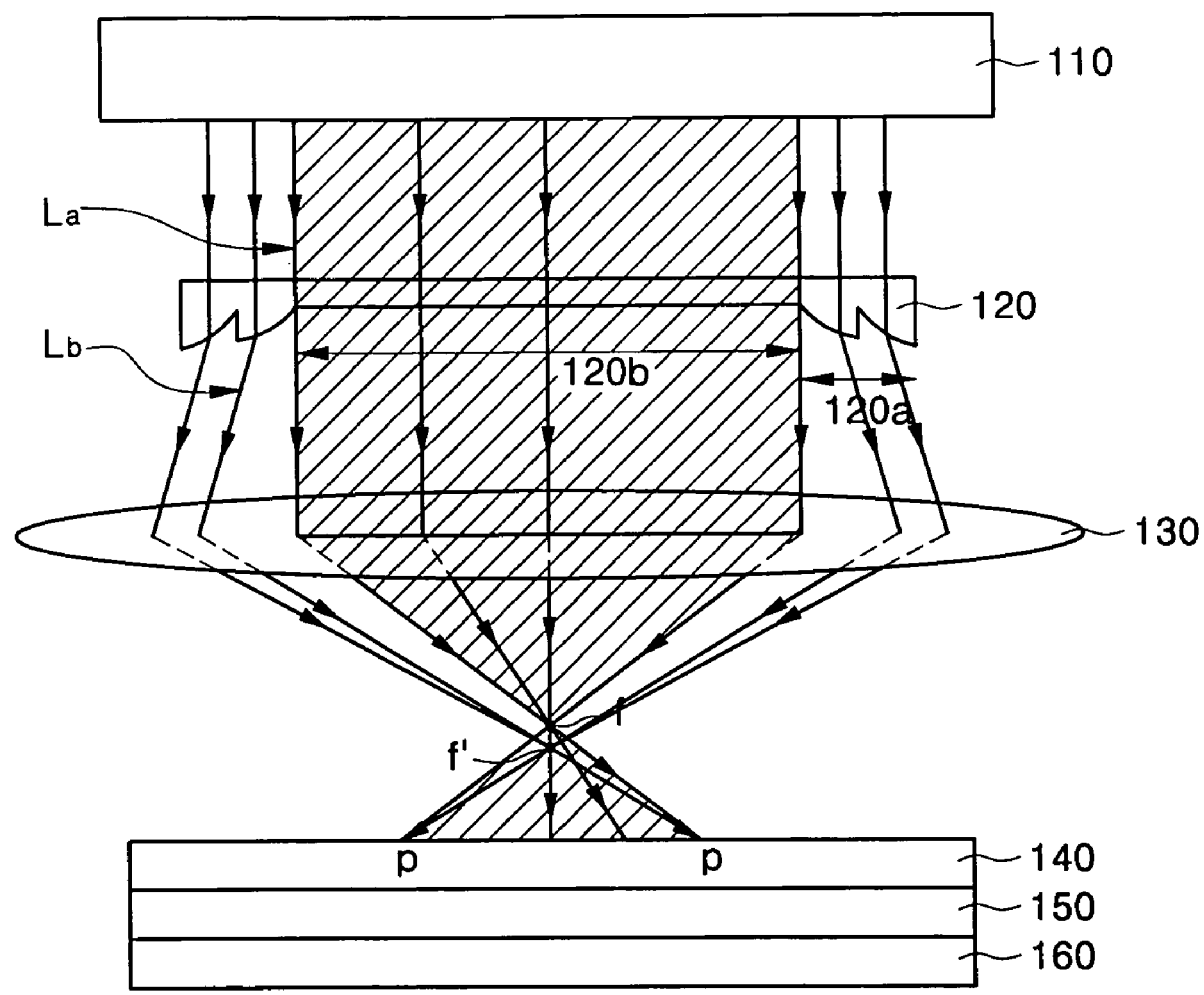
FIG. 2 is a graph representing a laser irradiation device and a patterning method using the laser irradiation device.

FIG. 2 is a graph representing a laser irradiation device and a patterning method using the laser irradiation device.

Referring to FIG. 2, a substrate 160 and a donor substrate 140 have a transfer layer 150. After laminating the substrate 160 and the donor substrate 140, they are exposed to a laser irradiation device 100.

The laser irradiation device 100 includes a light source 110, a mask disposed under the light source 110, and a projection lens 130 disposed under the mask 120. The mask 120 can be divided into a first region 120a including a Fresnel lens disposed at a predetermined portion thereof to change an optical path from the light source 110, and a second region 120b, in which no Fresnel lens is formed.

Preferably, the mask 120 including the Fresnel lens is formed of a transparent material. For example, the transparent material can be glass or transparent plastic. In this process, the transparent material can be formed of one material selected from a group consisting of polymethylmethaacrylate (PMMA) series, polycarbonate series, polyimide series, and polyethyleneetherephthalate (PET) series.

Then, laser radiation is focused onto a region of the donor substrate to be transferred, using the laser irradiation device, to form a transfer layer pattern on the substrate. The laser radiation can be focused onto an edge of the irradiated portion of the donor substrate so as to have an energy density greater than that of the laser radiation focused on the other areas of the irradiated portion.

In this process, reviewing a path of the laser radiation irradiated onto the donor substrate, the laser radiation is emitted from the light source 110 of the laser irradiation device 100 to be transmitted through the mask 120. The laser radiation passes through the second region 120b of the mask 120 to arrive at the projection lens 130, and the laser radiation is then transmitted through the projection lens and irradiated onto the donor substrate 140 through the primary refraction. The laser radiation that passes through the first region 120a arrives at the projection lens 130 through the primary refraction by the Fresnel lens for changing the optical path, and then is secondarily refracted while passing through the projection lens to be irradiated onto a predetermined portion P of the donor substrate, to which the laser radiation that passed through the second region 120b was irradiated, in an overlapping manner.

A focus f' of the laser radiation transmitted through the first region 120a is adjusted to a focus f of the laser radiation transmitted through the second region 120b using the Fresnel lens so that the laser radiation that passed through the first region 120a can be irradiated onto a point P of the region of the substrate to which the laser radiation transmitted through the second region 120b has irradiated, in an overlapping manner. That is, laser radiation La and laser radiation Lb can be irradiated onto the point P of the donor substrate by making a distance of the focus f' by the laser radiation Lb transmitted through the first region 120a greater than that of the focus f by the laser radiation La transmitted through the predetermined portion of the second region 120b.

As a result, since the laser radiation can be partially concentrated at a desired region through the Fresnel lens for changing an optical path, it is possible to concentrate the laser radiation at a periphery of the transfer layer pattern region requiring high intensity laser radiation, and to irradiate other regions with low intensity laser radiation sufficient to separate the transfer layer from the donor substrate.

In addition, in a laser radiation induced thermal imaging process, the laser radiation, which was blocked and lost by the conventional mask, is irradiated onto a region that requires high intensity laser radiation, thereby increasing the laser efficiency.

In this process, preferably, the transfer process is performed in a $N_2$ atmosphere in order to prevent the organic layer pattern from being oxidized by oxygen existing in the air. Since making the $N_2$ atmosphere requires a considerable amount of time and money, preferably, $N_2$ is charged until each of $O_2$ and $H_2O$ is less than 100 ppm, in consideration of the condition that oxygen and moisture do not affect the transfer layer.

In addition, the transfer process can be performed in a vacuum atmosphere to suppress generation of bubbles between the donor substrate and the substrate when the donor substrate is laminated on an entire surface of the substrate.

The Fresnel lens has a structure in which pieces of convex lenses having different focuses are adhered to each other.

FIGS. 3A to 3D are cross-sectional views of a mask having a Fresnel lens in accordance with an embodiment of the present invention.

Figure 3A:
FIGS. 3A to 3D are cross-sectional views of a mask having a Fresnel lens in accordance with an embodiment of the present invention.
Figure 3B:
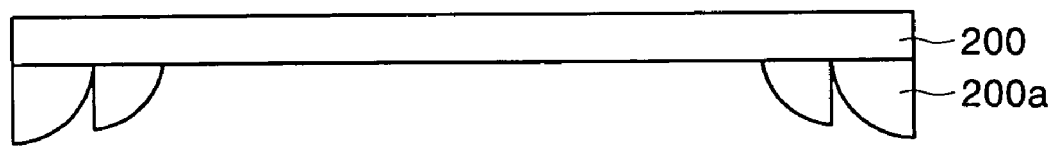
Figure 3C:
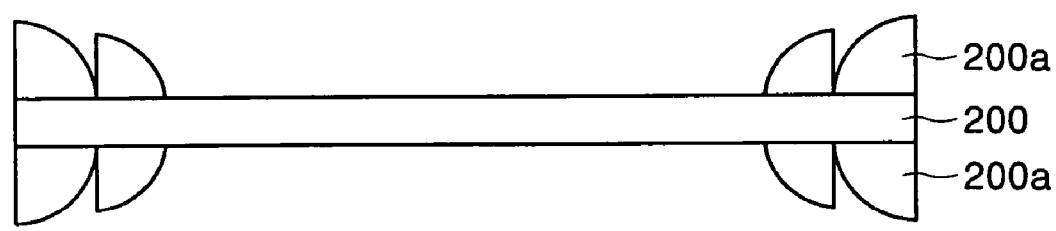
Figure 3D:
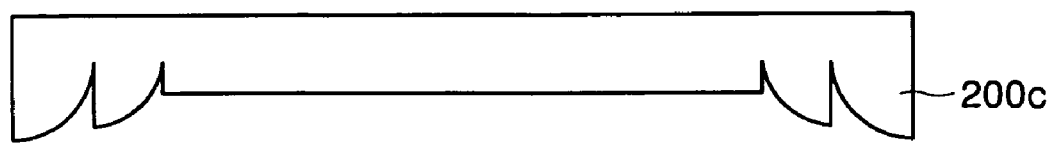

As shown in FIGS. 3A to 3C, a method of forming the Fresnel lens can be to attach the Fresnel lens 200a to an upper surface, a lower surface, or both surfaces of the mask. The Fresnel lens and the mask are preferably formed of a transparent material.

On the other hand, the method of forming the Fresnel lens can include machining a predetermined portion of the mask formed of a transparent material in a Fresnel lens shape. For example, the machining method can include molding the lens using a mold, or engraving a predetermined portion of the mask.

Figure 4A:
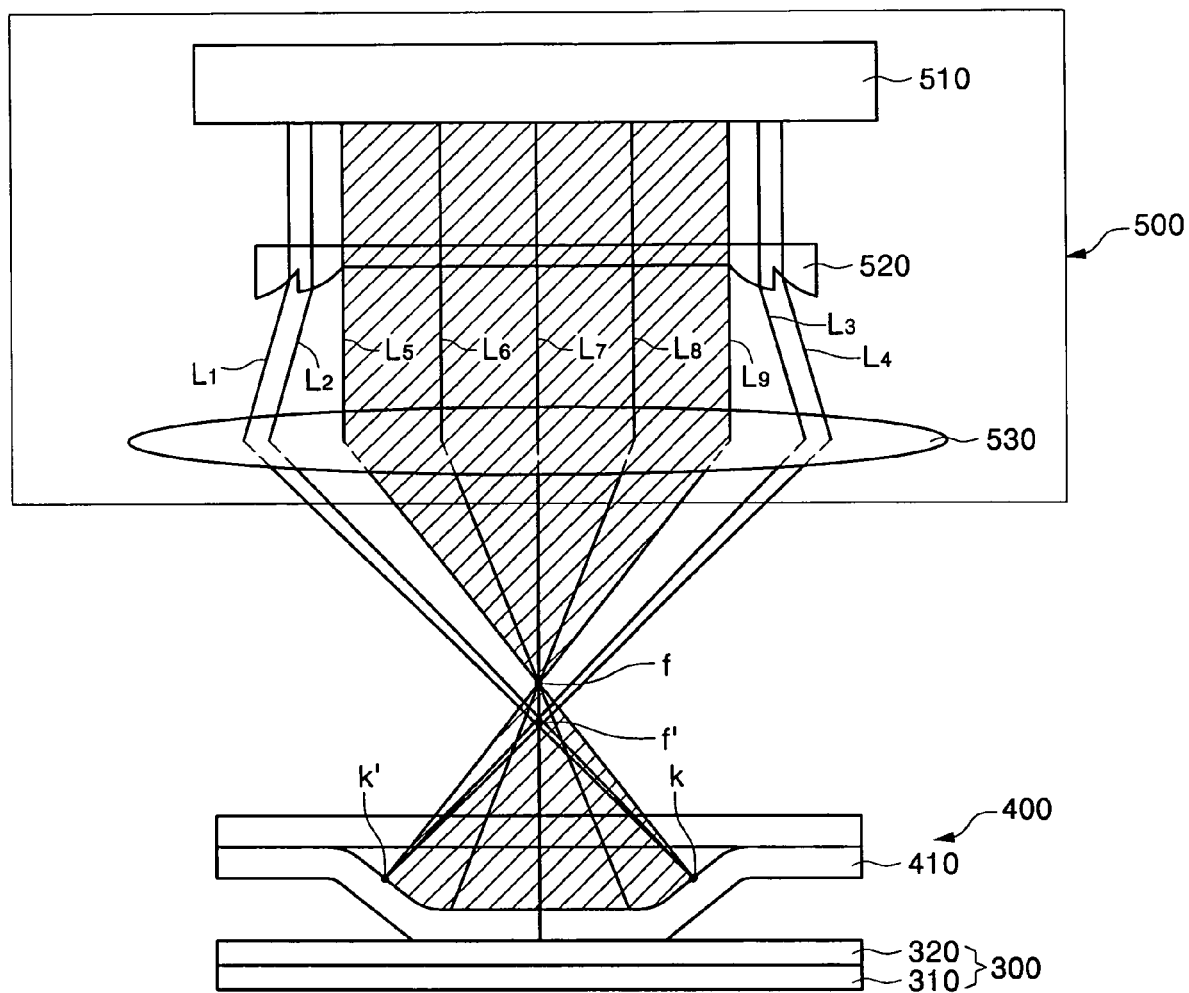
FIGS. 4A and 4B are a cross-sectional view and a laser profile of a method of fabricating an OLED using a laser irradiation device in accordance with an embodiment of the present invention, respectively.
Figure 4B:
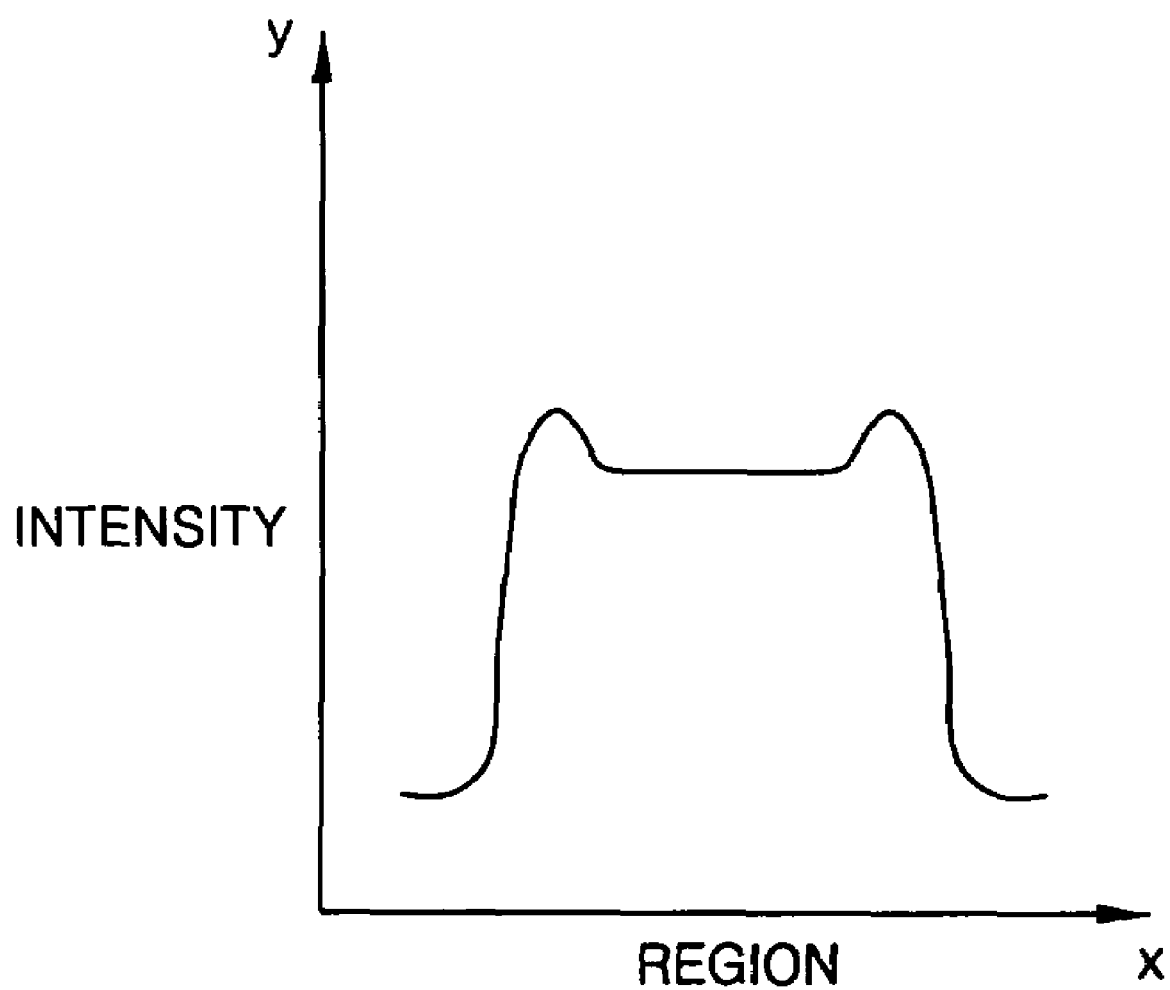

FIGS. 4A and 4B are respectively a cross-sectional view and a laser profile of a method of fabricating an OLED using a laser irradiation device in accordance with an embodiment of the present invention.

Referring to FIG. 4A, after a first substrate 310 is provided, a pixel electrode 320 is formed on the first electrode 310 to form a substrate 300. A thin film transistor, a capacitor, and a plurality of insulating layers can be formed between the pixel electrode 320 and the first electrode 310 to improve the functions of the OLED. Then, a donor substrate 400 including at least one organic layer 410 is laminated on the substrate 300.

Next, a laser irradiation device 500 irradiates laser radiation onto the donor substrate 400 to transfer the organic layer 410 onto the substrate 300 having the pixel electrode 320, thereby forming an organic layer pattern.

The laser irradiation device 500 includes a light source 510, a mask 520, and a projection lens 530. The mask 520 includes the Fresnel lens by attaching the Fresnel lens to a predetermined portion of the mask 520, or machining the mask 520 in the Fresnel lens shape. The Fresnel lens can be disposed on an upper surface, a lower surface, or both surfaces of the mask.

The laser radiation generated by the light source 510 arrives at the projection lens 530 through the mask 520, and is then irradiated onto the donor substrate 400 through the projection lens 530 as a shape of the organic layer pattern.

Portions L5 to L9 of the laser radiation irradiated onto the organic layer pattern pass through a portion of the mask, at which the Fresnel lens has not been formed, to be primarily refracted through the projection lens 530 to be irradiated onto the donor substrate in a shape of the organic layer pattern. On the other hand, other portions L1 to L4 of the laser radiation transmitted through the Fresnel lens formed at a predetermined region of the mask 520 arrive at the projection lens through the primary refraction of the Fresnel lens, and is then irradiated onto edges K and K' of the organic layer pattern shape of the donor substrate through the secondary refraction of the projection lens. As a result, the laser radiation intensely irradiates onto the edges K and K' of the organic layer pattern shape, i.e., a portion of the organic layer, which is to be broken.

That is, a focus of the laser radiation can be adjusted by the Fresnel lens to control the region, to which the laser radiation is irradiated.

As described above, the focuses of the laser radiation L1 to L4, which are blocked by the conventional mask, are adjusted by the Fresnel lens to irradiate the laser radiation onto the regions K and K' that require high intensity laser radiation so that a uniform organic layer pattern can be formed even though laser radiation with an appropriate intensity sufficient to separate the organic layer from the donor substrate is irradiated.

Referring to FIG. 4B, a laser radiation profile irradiated onto the donor substrate 400 is illustrated. An x-axis represents a region to which the laser radiation is irradiated, and a y-axis represents the intensity of the laser radiation. Reviewing FIG. 4B, it is appreciated that an irregular laser radiation intensity is irradiated onto the donor substrate, and both ends of the irradiated region have a high intensity laser radiation profile.

The laser radiation at the region that represents the high intensity is used to break the connection in the organic layer 410, and the laser radiation at the region that represents the low intensity is used to separate the organic layer 410 from the donor substrate 400 to transfer the organic layer 410 onto the substrate 300.

As described above, by using laser radiation blocked by the conventional mask, it is possible to form a uniform organic layer pattern using low intensity laser radiation, and therefore effectively use the laser radiation. In addition, since the low intensity laser radiation is irradiated onto the organic layer, damage to the organic layer can be reduced.

The organic layer pattern includes at least an emission layer, and can further include at least one layer selected from a group consisting of a hole injection layer, a hole transport layer, a hole blocking layer, an electron transport layer, and an electron injection layer.

Then, an upper electrode is formed on the organic layer pattern, and an encapsulating cap can seal the entire surface to complete the OLED.

As can be seen from the foregoing, in the laser irradiation device including the Fresnel lens for changing an optical path, since the laser radiation can be intensively irradiated onto a desired region, the laser radiation blocked by the conventional mask is irradiated onto the desired region to enhance the laser efficiency of the light source.

In addition, in accordance with the present invention, since the energy density of the laser radiation irradiated onto the donor substrate can be partially adjusted by the Fresnel lens formed at a predetermined portion of the mask to change the optical path, damage to the organic layer can be reduced, and a uniform organic layer pattern can be formed.

Although the present invention has been described with reference to certain exemplary embodiments thereof, modifications can be made to the described embodiments without departing from the scope of the present invention.

What is claimed is:

1. A laser irradiation device to irradiate a substrate, the device comprising:
   a light source;
   a mask arranged under the light source; and
   a projection lens arranged under the mask;
   wherein the mask includes a first region including a Fresnel lens arranged on a predetermined portion thereof to change an optical path of light generated by the light source and a second region including no Fresnel lens to allow the light generated by the light source to pass therethrough without changing an optical path of the light, the first and second regions lying in the same plane and the first region enclosing the second region; and
   wherein the light whose path has been changed by the Fresnel lens is focused onto an edge of a portion of the substrate irradiated by the irradiation device to produce an energy density greater than the energy density of other portions of the irradiated substrate.

2. The laser irradiation device according to claim 1, wherein the Fresnel lens is arranged on at least one of an upper surface and a lower surface of the mask.

3. The laser irradiation device according to claim 1, wherein the Fresnel lens is arranged on the mask by machining a predetermined portion of the mask to have a Fresnel lens shape.

4. The laser irradiation device according to claim 1, wherein the mask comprises a transparent material.

5. The laser irradiation device according to claim 4, wherein the transparent material comprises either glass or transparent plastic.

6. The laser irradiation device of claim 1, wherein light focused on the edge of the portion of the substrate irradiated by the Fresnel lens overlaps light irradiating the edge of the portion of the substrate irradiated by the second region of the mask having no Fresnel lens.

* * * * *